United States Patent [19]

Wyman et al.

[11] 4,253,065

[45] Feb. 24, 1981

[54] CLOCK DISTRIBUTION SYSTEM FOR DIGITAL COMPUTERS

[75] Inventors: Robert H. Wyman, Brentwood; Herschel H. Loomis, Jr., Davis, both of Calif.

[73] Assignee: The United States of America as represented by the United States Department of Energy, Washington, D.C.

[21] Appl. No.: 966,710

[22] Filed: Dec. 5, 1978

[51] Int. Cl.³ ........................... H03B 1/04; H03K 5/22
[52] U.S. Cl. ..................................... 328/164; 328/56; 328/65; 328/66; 328/109; 307/268
[58] Field of Search ................... 328/53, 56, 164, 58, 328/162, 65, 66, 109; 307/268

[56] References Cited

U.S. PATENT DOCUMENTS

| | | | |
|---|---|---|---|
| 3,007,060 | 10/1961 | Guenther | 307/268 X |
| 3,187,199 | 6/1965 | Chur | 307/268 X |
| 3,584,310 | 6/1971 | Hochfelder et al. | 328/164 |
| 3,838,347 | 9/1974 | Lauffer | 328/164 |
| 3,985,970 | 10/1976 | Lerault et al. | 328/164 X |
| 3,986,053 | 10/1976 | Doemer | 307/268 |

OTHER PUBLICATIONS

Bell Sys. Tech. Journal, Mar. 1969, pp. 615-636, "Synchronizing Digital Networks" by Pierce.
NBS Technical Note 691, issued Nov. 1976, "Clock Bell Sync & Comparason: Problems, Techniques & Hardware" by J. Gray.
Bell Sys. Tech. Journal, Nov. 1963, pp. 2679-2714, "Systematic Jitter in a Chain of Digital Regenerators" by Byrne et al.
U. of Pa. Engn. Report, "Badly Timed Elements & Well Timed Nets" by R. McNaughton, Jun. 10, 1964.
Proceedings IEEE Conf. on Switching & Automata, 1965, by E. W. Veitch, pp. 162-167.
IEEE Trans: On Computers, vol. C-9, 1970, pp. 39-47, 116-124, "A Scheme for Synchronizing High Speed Logic" by H. H. Loomis & M. R. McCoy.

Primary Examiner—John S. Heyman
Attorney, Agent, or Firm—James E. Denny; Roger S. Gaither; Clifton E. Clouse, Jr.

[57] ABSTRACT

Apparatus for eliminating, in each clock distribution amplifier of a clock distribution system, sequential pulse catch-up error due to one pulse "overtaking" a prior clock pulse. The apparatus includes timing means to produce a periodic electromagnetic signal with a fundamental frequency having a fundamental frequency component $V'_{01}(t)$; an array of N signal characteristic detector means, with detector means No. 1 receiving the timing means signal and producing a change-of-state signal $V_1(t)$ in response to receipt of a signal above a predetermined threshold; N substantially identical filter means, one filter means being operatively associated with each detector means, for receiving the change-of-state signal $V_n(t)$ and producing a modified change-of-state signal $V'_n(t)$ (n=1, ..., N) having a fundamental frequency component that is substantially proportional to $V'_{01}(t - \theta_n(t)$ with a cumulative phase shift $\theta_n(t)$ having a time derivative that may be made uniformly and arbitrarily small; and with the detector means n+1 ($1 \leq n < N$) receiving a modified change-of-state signal $V_n(t)$ from filter means no. n and, in response to receipt of such a signal above a predetermined threshold, producing a change-of-state signal $V_{n+1}(t)$.

10 Claims, 11 Drawing Figures

CLOCK DISTRIBUTION SYSTEM FOR DIGITAL COMPUTERS

BACKGROUND OF THE INVENTION

The invention described herein was made in the course of, or under Contract No. W-7405-ENG-48 with the U.S. Department of Energy.

FIELD OF INVENTION

This invention relates to clock distribution systems for digital computers, and more particularly to method and apparatus for error elimination within clock distribution systems.

Previous studies have indicated that, where only logic and delay are used, a clock distribution system without feedback will fail where variation of the switching threshold causes variation in the delay for change of state within the individual clock distribution amplifiers (CDAs). In such an instance, the magnitude of the error propagated through threshold variation increases without bound if the number of CDAs is likewise unlimited, and ultimately one pulse "catches-up" with and masks the prior pulse propagating through the system. If one incorporates feedback between CDAs, of course, such errors may be eliminated, but only at the cost of substantially increased (by a factor of two or more) characteristic times for signal propagation. Prior clock distribution systems used logic and delay, while the subject invention uses logic, delay and energy storage in the design of a clock distribution system without feed-back which will not fail by sequential pulse catch-up mechanisms which caused failure of the earlier systems.

Conventional clock distribution systems resemble a tree, with a clock generator at the base and a sequence of clock amplifiers connected thereto. The amplifiers are typically pulse amplifiers that produce a standard pulse amplitude and, ideally, a standard pulse width. The pulse shape is normally considered to be trapezoidal, and the amplifiers are assumed to switch from a lower state to an upper state with hysteresis. Switching occurs from the lower state to the upper state as an electromagnetic signal rises above a first threshold $V_{LU}$; switching occurs from the upper to the lower state as the electromagnetic signal first falls below a second threshold $V_{UL}$. The first and second thresholds need not be identical, although in practice this may be more convenient; it is desirable, however, that the threshold values themselves not vary with time. Where this undesirable threshold variation is present, there is clearly a reasonable pair of varied thresholds for each amplifier which will cause any entering pulse to be slightly narrowed at the exit, vis-a-vis the pulse standard width; a sequence of clock distribution amplifiers may thus be fabricated such that, at some point, the output pulse of one amplifier is too narrow to trigger the the following stage, due to disabling overlap with the prior consecutive pulse, In this instance, one then says that the later pulse "catches up" with the earlier one and the two pulses become indistinguishable by the clock distribution system.

Robert McNaughton ("Badly-Timed Elements and Well-Timed Nets," University of Pennsylvania, Moore School of Electrical Engineering Report, June 10, 1964) showed that no indefinitely long string of delays without feedback would work if the delays had mechanisms which allowed them to vary in time, even though the variation at each stage was limited. McNaughton imposed five conditions which limit the number of elements directly connected together, as well as limiting the number of inputs and outputs at any stage. McNaughton also showed that an indefinitely large system of logic units could be made to work if feedback were allowed between the units.

Many of McNaughton's results are confirmed in a study by Veitch ("A Proof Concerning Infinite Nets of Logic Elements Without Feedback," Proceedings of the I.E.E.E. Conference on Switching and Automata, 1965.) The Veitch model consists of a chain of computing modules, each of which is capable of storing some specific number of information bits; each model receives data and control information from the preceding module and passes similar data to the following module. Each module has an internal clock which is subject to limited frequency variation as the source of error in the system.

Loomis and McCoy (I.E.E.E. Transactions on Computers, Vol. C-19, 1970, pp. 39-47 and 116-124) consider a scheme for relative synchronization of pulses which is an extension of the McNaughton method. Loomis and McCoy utilize a lattice of interconnected pulse sources called clock pulse propagators which generate clock pulses locally synchronized to the outputs of other adjacent clock pulse propagators, but which are not required to be in synchronization with some machine-wide standard.

Pierce (The Bell System Technical Journal, March 1969, pp. 615-636) considers a method of stable synchronization of large digital networks, wherein a multiplicity of clocks is used, each clock being equipped with frequency control for adjustments of its frequency above or below its "correct" value. Each receiver (the analog of the clock distribution amplifier) is equipped with a buffer which accepts a stream of digital bits at a certain received rate and emits the bits at a rate or frequency determined by the local clock with frequency control.

Gray, in "Clock Synchronization of Comparison:- Problems, Techniques and Hardware", National Bureau of Standards, Time and Frequency Division Tech. Note 691 (November 1976) discusses three types of system errors that may give rise to phase shifts in the clock synchronization pulses, namely (1) jitter in the initial clock pulse generation, (2) impedence mismatching at the end of or in the interior of a cable used for signal propagation, and (3) resolution and trigger errors associated with the individual counters. Gray considers the use of structure redundancy as a means of correcting or controlling the magnitude of the errors encountered. Byrne, Karafin and Robinson, in "Systematic Jitter in a Chain of Digital Regenerators", The Bell System Technical Journal, November 1963, pp. 2679-2714, discuss the accumulation of jitter error in a long chain of N identical regenerators. A linear sequence of N identical timing filters of unspecified detail, one filter being associated with each regenerator, is used to act upon an input signal and produce a sequence of timing waves, each of which is then (re)shaped and sent to the next station. Jitter is introduced at each regenerator. The timing filter considered is a single pole low pass filter, with an associated frequency plane response function of $(1+S/B)^{-1}$ (s=complex frequency). Jitter accumulation is studied statistically, which generally will not reflect the worst attainable case, and it is found that mean square jitter increases as AN, where A is a constant and N is chain length. No bound is placed on the time rate of change of phase shifts at intermediate stations $n-1, 2, \ldots, N$ for the non-statistical worst attainable case.

The prior art disclosed by the abovementioned articles and reports uses redundant structures for a multiplicity of internal clocks to control clock rate error or analyzes development of clock phase shift error only statistically, which can obscure the disabling effects of the worst attainable case of such phase errors. The subject invention utilizes only a single clock and no redundant structures, and it controls the phase shift error associated with the worst attainable case.

SUMMARY OF THE INVENTION

The present invention provides apparatus for elimination, at each clock distribution amplifier, of the disabling error due to sequential pulse catch up. The invention uses logic, delay and energy storage to achieve this and comprises timing means for producing perodic signals, signal characteristic detector means for producing a change-of-state signal in response to receipt of an above-threshold signal from the timing means, and filter means which receives the change-of-state signal from the detector means for limiting the rate of the change of the magnitude of the change-of-state signal, thereby limiting the change in local frequency at any CDA.

It is an object of this invention to provide apparatus for the elimination of the disabling error due to sequential pulse catch up in a clock distribution amplifier, using logic, delay and energy storage.

Other objects and advantages of the invention will become apparent from the following description and accompanying drawings.

DESCRIPTION OF THE INVENTION

Figure 1:
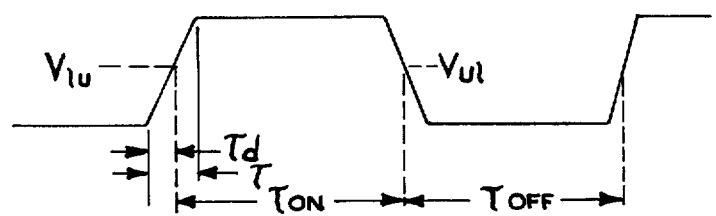
FIG. 1 is a graph of the trapezoidally-shaped periodic electromagnetic signals received from the clock generator, showing the ideal or correct thresholds $V_{LU}$ and $V_{UL}$ for a change of state of the amplifier.

Conventional computer clock distribution systems resemble a tree with the clock generator at the base, which drives a sequence of clock amplifiers. These amplifiers are typically pulse amplifiers which produce a standard pulse amplitude and, ideally, a standard pulse width. The input temporal pulse shape may be idealized as a trapezoidal periodic variation, as in FIG. 1. The pulse amplifiers respond to the periodic signal by changing their output voltage from low to high as the input voltage signal increases and passes through the threshold level $V_{LU}$; the amplifier changes its output voltage from high to low as the input voltage decreases and passes through the threshold level $V_{UL}$. The pulse amplifier may also invert the signal so that the output voltage changes from low to high as the input voltage decreases and passes through $V_{UL}$, with correspondingly inverted changes in response at $V_{LU}$, as described below. This does not affect the analysis or the final results on bounding of phase and rate of change of phase. As indicated in FIG. 1, the state of the clock distribution amplifier (CDA) does not change immediately as the periodic voltage signal at the CDA begins to increase; the CDA experiences a time delay $\tau_d$ which is the time required for the magnitude of the voltage to build up to the point where it exceeds the lower-upper threshold $V_{LU}$ required for change of state. A similar time delay is experienced where the periodic voltage begins to decrease from its maximum value.

Figure 2:
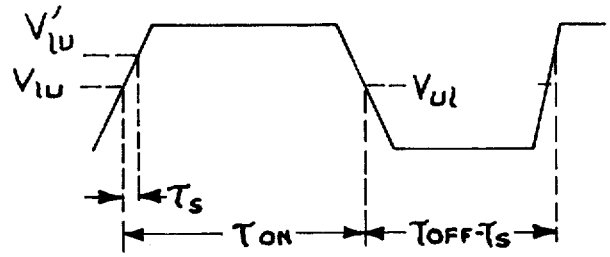
FIG. 2 is a graph of the trapezoidally-shaped periodic electromagnetic signal received from the clock generator, showing an altered or incorrect threshold $V'_{LU}$ for the change-of-state of the clock distribution amplifier.

Referring now to FIG. 2, the lower-upper threshold level $V_{LU}$ is allowed to vary so that it moves to some new position $V'_{LU}$ as shown. This modification in the threshold level adds to or subtracts from the original time delay $\tau_d$ an amount $\tau_s$, according as the new threshold level $V'_{LU}$ is larger than or smaller than the original "correct" threshold level $V_{LU}$. If one allows any CDA threshold $V_{LU}$ to vary in some direction, by a proper choice of lower-upper thresholds the exit pulse of the CDA will be measurably narrowed.

Given that the threshold of each CDA shifts by the same amount (in magnitude), clearly the worst possible situation occurs when all thresholds shift in the same direction. If the sequential pulse catchup error can be eliminated in this worst situation, it will be likewise eliminated in all others. In this worst situation, using only logic and a limited amount of delay as in the prior art, a tree of finite size of CDAs may be built in which, at some point, the output pulse of one CDA will be too narrow to trigger the following stage CDA due to sequential pulse catchup; said output pulse then overrides the preceding positive-going pulse, resulting in no signal for the combined pulses.

As noted above, one method of eliminating the disabling error due to sequential pulse catchup is a clock distribution system that uses feedback from each CDA to the preceding CDA. This system depresses the cumulative phase mismatch $$\sum_{i=1}^{n} (\tau_s)_i$$

at each CDA (ideally, to zero), but at the expense of an increase by a factor $\sim 2$ in time required for propagation of a signal along a computation chain associated with a chain of CDAs.

Figure 3:
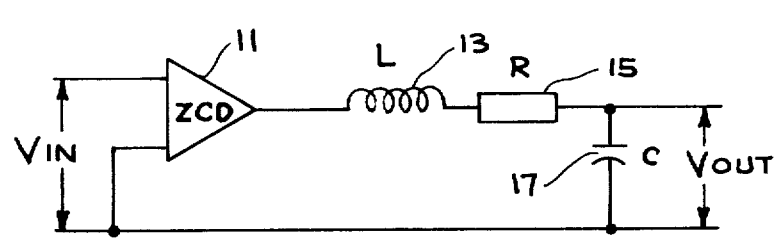
FIG. 3 is one embodiment of the filter means and signal characteristic detector means.
Figure 5:
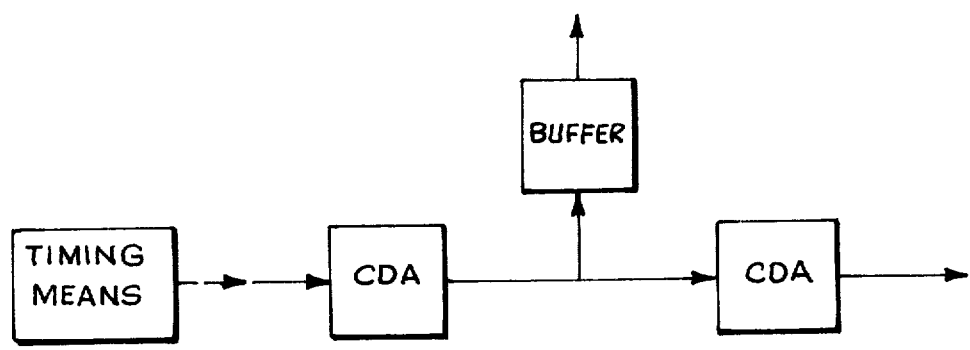
FIG. 5 schematically exhibits the relationship of the two consecutive clock distribution amplifiers in a clock distribution system.

FIG. 3 exhibits one embodiment of the subject invention for reducing cumulative phase mismatch without increasing the cycle-to-cycle time interval required for signal propagation along a chain. The invention, in its simplest form, is a CDA comprising a zero crossing detector (ZCD)11 in series with an LRC filter comprising an inductive element 13, a resistive element 15 and a capacitive element 17. A buffer, placed between any two consecutive CDAs as indicated in FIG. 5, serves to isolate each CDA from the local computation system.

One resonant frequency of the LRC filter (alias a frequency of peak response of the transfer function of the filter) coincides with the fundamental frequence $\omega_o$ of the ideal periodic signal, shown in FIG. 1, which arrives at any particular CDA. The ZCD output is normally symmetric about 0 volts and possesses only two values, say $+1$ volt and $-1$ volt; lower-upper and upper-lower transitions occur at $V_{in}=V_{LU}$ with $(d/dt)V_{in}>0$ and at $V_{in}=V_{UL}$ with $(d/dt)V_{in}<0$, respectively, and the transitions normally occur in a time which is very small compared to the reaction time of the filter. Although it is not essential, it is often convenient to set $V_{LU}=V_{UL}$ initially in the analysis of the response.

The analysis of the CDA response first assumes that the threshold $V_{LU}$ now changes so that the time for the lower-upper transition within a cycle changes by an amount $\tau_s$ (see FIG. 2). The threshold $V_{UL}$ may be assumed to remain fixed as it is only the net change $V'_{LU}-V_{LU}$ that produces the shift $\tau_s$ which is of interest here. For convenience, the time variable t is normalized so that the fundamental input is $\omega_o=1$ radian per second. The trapezoidal input voltage to the filter (FIG. 1) is then represented by a Fourier series, viz $$V_{in}(t) = \frac{8}{\pi\tau} \sum_{n=1}^{\infty} \frac{\sin(2n-1)\frac{\tau}{2}}{(2n-1)^2} \sin((2n-1)t), \quad (1)$$

and the idealized voltage $V_{ZCD}$ as a square wave (FIG. 4) issuing from the ZCD is represented by another series, viz $$V_{ZCD}(t) = \frac{4}{\pi} \sum_{n=1}^{\infty} \frac{\sin(2n-1)t}{2n-1}. \quad (2)$$

Finally, the transfer function of the LRC filter in FIG. 3 is $$G(s) = \frac{\omega_o^2}{\left(s^2 + \frac{\omega_o s}{Q} + \omega_o^2\right)}, \quad (3)$$

where $\omega_o(=1$ here) is a resonant frequency of the filter circuit and $Q(\geq 10$ here) is the energy storage parameter at resonance.

Figure 4:
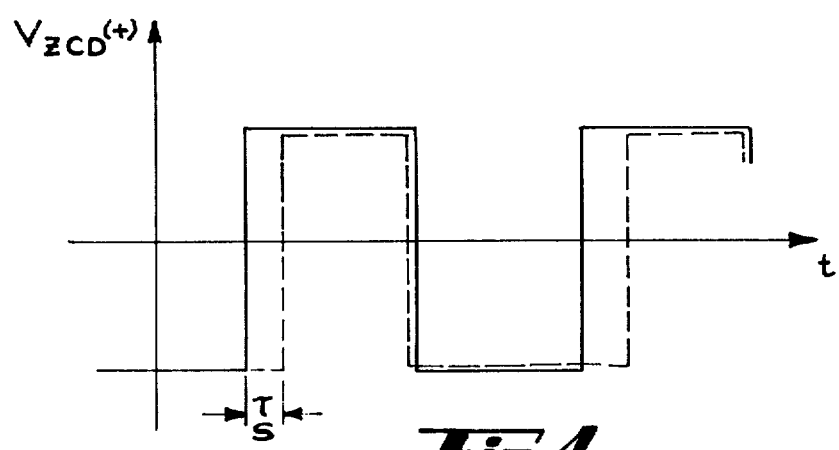
FIG. 4 is a graph of the ideal symmetric square wave output (solid line) and realistic output with threshold error (broken line) of the signal characteristic detection means.

Ideally, the output $V_{ZCD}(t)$ is a symmetric square wave, as shown in the solid line in FIG. 4 and represented in Equation (2) above. But with a shift in the threshold $V_{LU}$ the time for transition from the lower state ($V_{ZCD}=-1$) to the upper state ($V_{ZCD}=+1$) shifts from $t=0$ to, say, $t=\tau_s$ (dotted lines in FIG. 4), and $V_{ZCD}(t)$ is representable as $$V_{ZCD}(t) = \frac{-\tau_s}{\pi} - \frac{2}{\pi} \sum_{n=1}^{\infty} \frac{1}{n} \{\sin(n\tau_s)\cos(nt) - \quad (4)$$

-continued
$$[\cos(n\tau_s) - \cos(n\pi)]\sin(nt)\}.$$

With a filter incorporated in the CDA, the CDA output would be substantially $$V_{OUT}(t) = \frac{-\tau_s}{\pi}(1 - e^{-t/2Q}\cos t) - \frac{2Q}{\pi}\sin\tau_s(1 - e^{-t/2Q})\sin t - \frac{2Q}{\pi}(1+\cos\tau_s)\cos t + O(\frac{1}{Q}) + O(\frac{1}{\omega^2}) \quad (5)$$

where the terms denoted $O(1/Q)$ are terms of order $1/Q$ which are essentially constant in time, and the terms denoted $O(1/\omega^2)$ are higher order terms of the general form $C_n(n^2+a^2)^{-1}\cos(nt+\phi_n)(n\geq 2)$, with $C_n$ monotone decreasing or bounded in n.

Ignoring all but the fundamental terms ($\alpha \cos t$ or $\sin t$), $V_{OUT}(t)$ may be written more generally in the rotating wave approximation $$V_{OUT}(t) = A(t)\cos[t-\theta(t)], \quad (6)$$

with slowly varying functions $A(t)$ and $\theta(t)$ chosen appropriately, for the first member of a chain of CDAs. Analysis of the effect of a chain of such CDAs upon such a signal indicates that the form of Equation (6) holds more generally (i.e. for the output of each CDA in the chain.) The quantities $A(t)$ and $\theta(t)$ will, of course, depend upon the number $n (=1,2,3,\ldots)$ of the CDA in the chain considered. For the fundamental frequency, one finds, after much analysis, that the filtered output is $$V_{f,out} = -\frac{4Q}{\pi}[\sin\frac{1}{2}\tau_s(1 - e^{-t/2Q})\sin(t+\frac{1}{2}\tau_s) + \cos t] \quad (7)$$

combined with Eq. (6), this yields $$\theta(t) = \tan^{-1}\left[\frac{\frac{1}{2}\sin\tau_s(1 - e^{-t/2Q})}{1 - \sin^2(\frac{1}{2}\tau_s)(1 - e^{-t/2Q})}\right] \quad (8)$$

$$\approx \frac{1}{2}\tau_s(1 - e^{-t/2Q})$$

$$\frac{d\theta}{dt} \leq \frac{\tau_s}{4Q}$$

One important result of the analysis is that the maximum time rate of change for the phase function $\theta_n(t)$ of the $n^{th}$ CDA in the chain also satisfies this inequality, viz $$(d/dt)\theta_n < \tau_s/4Q(\text{all } n). \quad (9)$$

Thus, the growth of sequential catchup error is limited at each stage by a number which is independent of time and of the number of prior stages (n), and which can be arbitrarily small by control of Q.

The upper bound estimate $d\theta/dt < \tau_s/4Q$ results from a linearized treatment of the effects of threshold shift. In an effort to confirm the existence of a finite, small upper bound on $d\theta/dt$ and to obtain a firm realistic estimate of same, if it exists, a chain of about 100 CDAs was modeled with $Q=10$ and $\omega_o=1$, the transition threshold of each ZCD was shifted a fixed amount, and the error was allowed to propagate and was monitored at time intervals $t_n=n(\pi/2)$ to determine error buildup. The observed maximum on $(d/dt)\theta$, attained near $t=0$, was nearly the same at each CDA and was about 7.6% higher than the maximum predicted from the linearized model. This indicated that the linear model is substantially correct. The linear model also predicts that the average value effects which arise from threshold shift are essentially local (i.e., they do not propagate from one CDA to the next) and are uncoupled from other phenomena studied.

Figure 6:
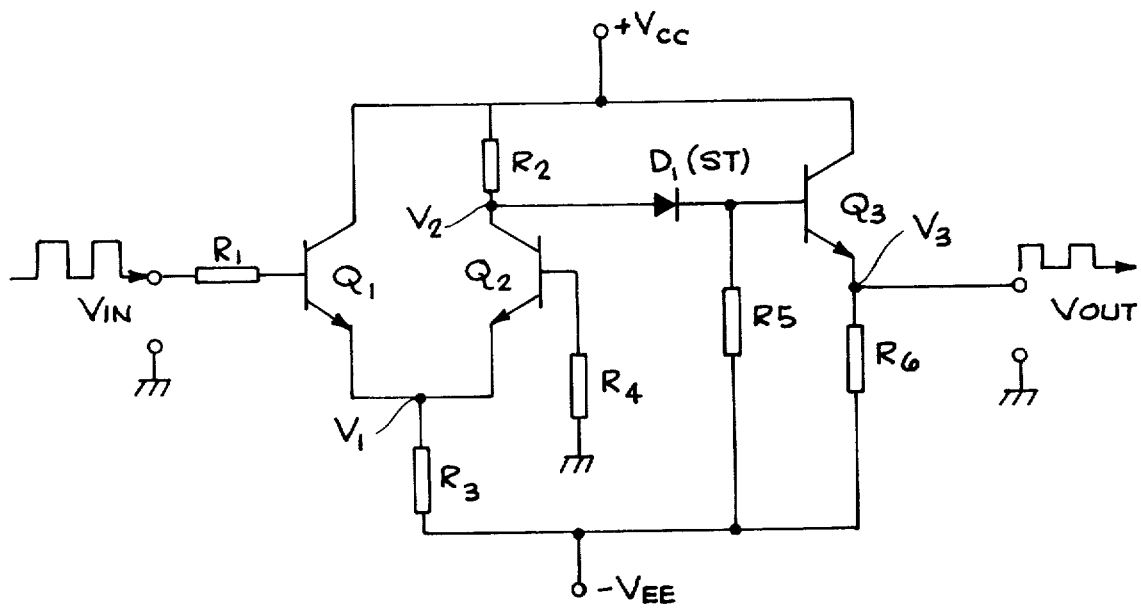
FIG. 6 shows a typical zero crossing detector device for detection of and response to threshold voltages.

A typical ZCD for detection of a response to threshold voltages is shown in FIG. 6. A pulse or sequence of voltage pulses enters transistor Q1 at the base. Transistor Q1 responds to the upper state of the incoming voltage $V_{in}$ by turning partially (but not fully) on so that $V_1$ attains a value near to but somewhat below $V_{in}$. Transistor Q2 now turns off and voltage $V_2$ goes high, producing an upper state pulse $V_{OUT} = V_3 = \hat{V}_3$ at the emitter of the emitter follower transistor Q3, where $\hat{V}_3$ is the upper state voltage output for the ZCD. The magnitude of $V_2$ is determined by resistors R2 and R5 and by the offset voltage of diode D1. In response to the lower state of $V_{in}$ arriving at Q1, this transistor turns off with $V_1 = -V_{BE}$, the base-emitter offset voltage of Q2, and Q2 turns partly on, thus lowering $V_2$ to a value determined by resistor R2 and R3. The output voltage now drops to $V_{OUT} = V_3 = -\hat{V}_3$. Thus, a sequence of approximately square wave pulses is generated at the output.

Figure 7:
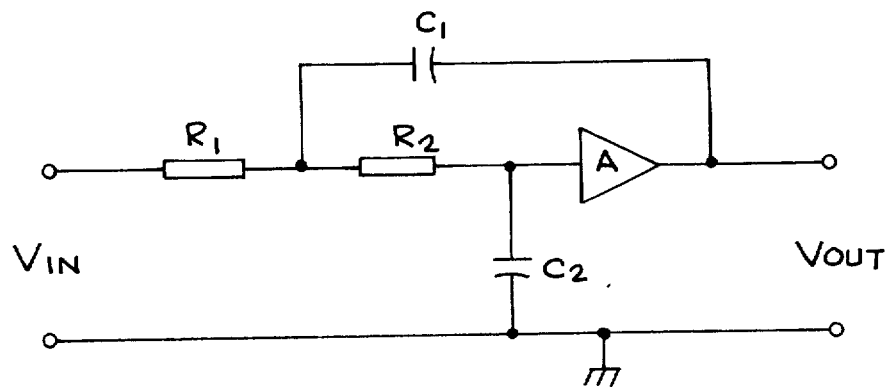
FIG. 7 shows an active second order filter which may replace the LRC filter or tank circuit of FIG. 3.

FIG. 7 exhibits a second order active filter which may replace the LRC filter of FIG. 3. The active filter comprises two resistors R1 and R2, two capacitors C1 and C2, and an amplifier A. The transfer function or gain for this filter is $$G(s) = \frac{\frac{1}{R_1 C_1 R_2 C_2}}{s^2 + \left(\frac{1-A}{R_2 C_2} \frac{1}{R_1 C_1} + \frac{1}{R_2 C_1}\right)s + \frac{1}{R_1 C_1 R_2 C_2}}. \quad (10)$$

A choice of amplifier gain coefficient $A < 1$ guarantees stability, but any reasonable choice of A may be made. Again, one chooses the parameters so that the frequency at peak response (e.g., $\omega = 1$ radian/sec.) coincides with the fundamental frequency of the incoming signal at the ZCD.

Figure 10:
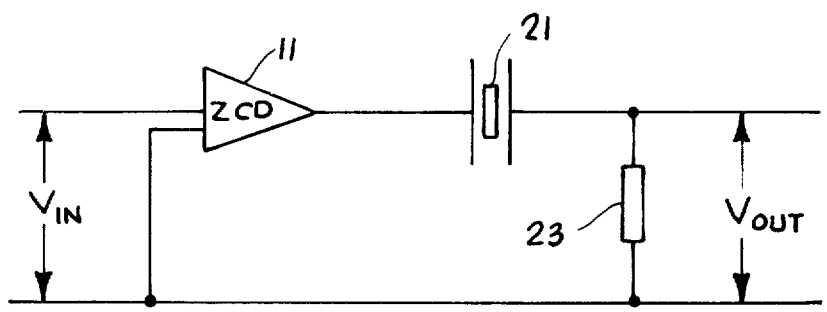
FIGS. 10 and 11 show alternative combinations of an electromagnetic filter and a shunt resistance replacing the LRC filter of FIG. 3.

The LRC filter of FIG. 3 may be replaced by an electromechanical filter 21 and a shunt resistance 23 positioned as shown in FIG. 10. At or near resonance ($\omega \approx 1$), the impedance of the filter 21 is quite small, having a magnitude of the order of 1000 ohms, and a large current is shunted through the resistor 23 which also has a resistance value $\gtrsim 1000$ ohms. Where resonance is not present ($\omega << 1$ or $\omega >> 1$), the filter 21 has a high impedance and, again, current is shunted through the resistor 23.

Figure 11:
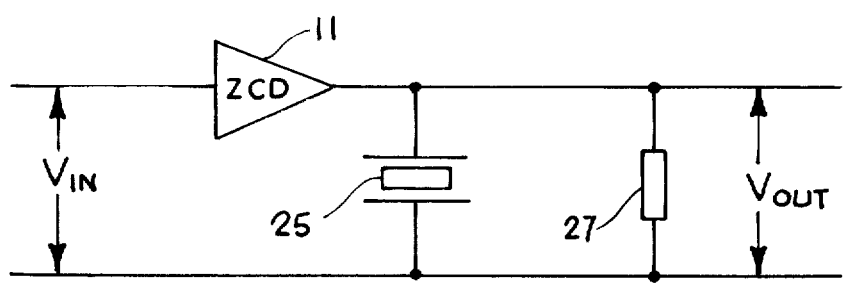

Another alternative is shown in FIG. 11, where an electromechanical filter 25 is arranged in parallel with a shunt resistor 27. Here the impedance of the filter 25 is very high at or near resonance ($\omega \approx 1$), and the resistor 27 has associated resistance of 1,000–10,000 ohms so that most of the current flows through the resistor. Off resonance ($\omega << 1$ or $\omega >> 1$), the filter impedance is low, and the filter draws much of the current flow.

Figure 8:
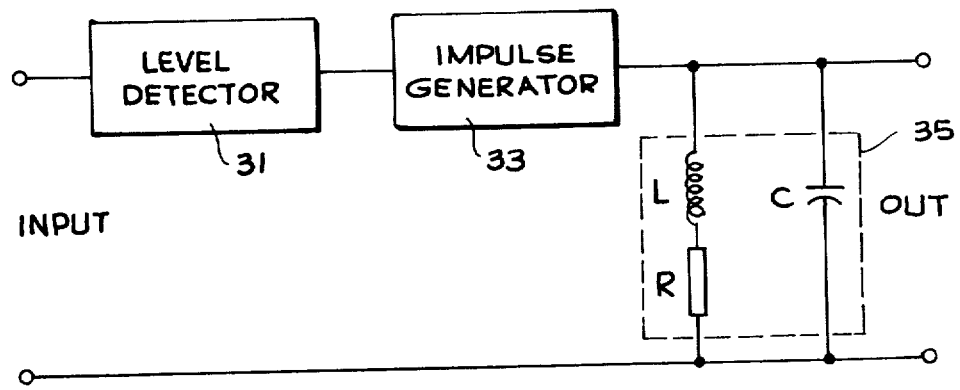
FIG. 8 exhibits an alternative embodiment of the invention, namely the "dual" of FIG. 3.

An alternative embodiment of the invention is shown in FIG. 8, wherein the CDA comprises a peak or level detector 31 and impulse generator 33 together replacing the zero crossing detector and a filter comprising inductive-resistive and capacitive means in parallel. This embodiment functions as shunt-driven model and is the dual of FIG. 3. The peak detector and impulse generator, acting in concert, produce a current impulse in response to the arrival of a periodic incoming signal with a detectable peak. The current impulse drives the LRC tank circuit 35, which has a peak response at the fundamental frequency of the incoming signal as before. Analysis, similar to the foregoing, of the voltage response to a periodic sequence of pulses when the transition thresholds $V_{LU}$ all suddenly change to $V'_{LU}$ is carried through as before. In the rotating wave approximation $$V(t) = A(t)\sin[t - \theta(t)]$$

applied to the voltage developed at the output of each CDA, one finds the bound $$d\theta/dt < \tau_s/4Q$$

Once again, then, the sequential catch up error and its time rate of change are suppressed so that one signal cannot catch up to and destroy the preceding signal through deleterious shifts in transition thresholds in the peak detector.

Figure 9:
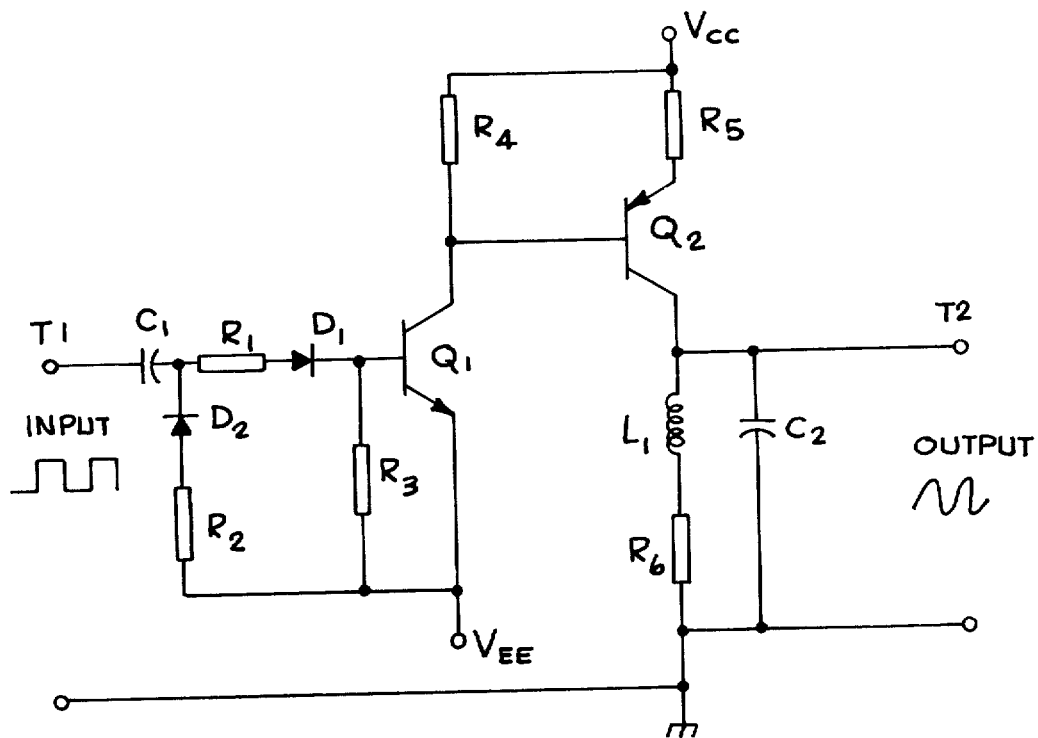
FIG. 9 shows one embodiment of the current impulse generator and filter used in the embodiment of FIG. 8.

One embodiment of the current impulse generator of FIG. 8 is shown in FIG. 9. An input, having an upper and lower state, appears at input terminal T1 and passes through a capacitor C1 and a parallel network of resistive means and diodes (R1, D1 and R2, D2) to the base of transistor Q1. As the input to Q1 rises, Q1 turns partly on, which turns transistor Q2 partly on and produces high state at the collector of Q2. If the input to C1 and thus to Q1 is low, Q1 turns off as does Q2, and the output at terminal T2 is determined by the RLC tank circuit energy. Inductor L1, resistor R6 and capacitor C2 comprise a tank circuit for the generator. The magnitude of the current pulse produced at T2 is determined by resistors R4 and R5 and by the magnitude of $V_{ee}$ relative to $V_{cc}$ ($>V_{ee}$); pulse duration is controlled by C1 and R1.

Many of the calculations alluded to herein are discussed in some detail in Robert H. Wyman, "Clock Distribution Systems For Digital Computers" (Ph. D thesis, Department of Applied Science, University of California at Davis), also to be issued by Lawrence Livermore Laboratory as UCRL-51994.

Although the preferred embodiments of the invention have been shown and described herein, variation and modification may be made without departing from what is considered to be the invention.

We claim:

1. Apparatus for elimination of disabling error due to shift of the trigger voltage thresholds for one or more clock distribution amplifiers in a computer clock distribution system, the apparatus comprising:

timing means for producing a periodic electromagnetic signal $V'_o(t)$ having a fundamental frequency and a fundamental frequency component $V'_{o1}(t)$;

a linear array of $N(\geq 2)$ signal characteristic detector means, with the detector means no. 1 receiving the periodic electromagnetic signal from the timing means and producing a change-of-state $V_1(t)$ in response to receipt of the signal from the timing means that is above a predetermined threshold;

N substantially identical filter means, one such filter means being operatively associated with each signal characteristic detector means, for receiving the change-of-state signal $V_n(t)$ and producing a modified change-of-state signal $V'_n(t)$ having a fundamental frequency component that is substantially proportional to $V'_{01}(t-\theta_n(t))$, with an associated cumulative phase shift $\theta_n(t)$ that satisfies $|d\theta_n/dt| < \epsilon$, where $\epsilon$ is dependent upon the magnitude of the trigger voltage threshold shift and upon the Q factor of the circuit of the associated filter means, and $\epsilon$ may be made arbitrarily small, independently of n and N, and t; and with the detector means $n+1 (1 \leq n < N)$ receiving a modified change-of-state signal $V'_n(t)$ from filter detector means no. n and, in response to receipt of such a signal above a predetermined threshold, producing a change-of-state signal $V_{n+1}(t)$.

2. Apparatus according to claim 1, wherein said signal characteristic detector means is a zero crossing detector.

3. Apparatus according to claim 1, wherein said signal characteristic detector means is a peak detector.

4. Apparatus according to claim 1, wherein said filter means comprises an inductor, a resistor, and a capacitor arranged in series with said associated signal characteristic detector means.

5. Apparatus according to claim 1, wherein said filter means comprises a first and a second resistor and an amplifier arranged in series with said signal characteristic detector, a capacitor arranged in parallel with the second resistor and the amplifier, and a capacitor with one terminal grounded and the other terminal electrically connected between the second resistor and the amplifier.

6. Apparatus according to claim 1, wherein said filter means comprises an electromechanical filter and a resistor arranged in series with said associated signal characteristic detector means.

7. Apparatus according to claim 1, wherein said filter means is an electromechanical filter and a resistor in parallel, arranged in series with said associated signal characteristic detector means.

8. Apparatus according to claim 1, wherein said filter means has an associated transfer function with a peak response at a frequency that is substantially identical with said fundamental frequency of said periodic electromagnetic signal.

9. Apparatus according to claim 1, wherein said filter means has a transfer function with a maximum response at a frequency that is substantially identical with said fundamental frequency of said periodic electromagnetic signal.

10. Apparatus according to claim 1, wherein said filter means has a transfer function with a maximum response at a frequency that is substantially identical with said fundamental frequency of said filter means, and said filter means is an electromechanical filter and a resistive element, arranged in parallel.

* * * * *